United States Patent
Kim et al.

(10) Patent No.: US 7,119,285 B2
(45) Date of Patent: Oct. 10, 2006

(54) FLEXIBLE PRINTED CIRCUIT BOARD

(75) Inventors: Deok-heung Kim, Yongin-si (KR); Bong-hui Lee, Yongin-si (KR)

(73) Assignee: Samsung Techwin Co., Ltd., (KR)

( * ) Notice: Subject to any disclaimer, the term of this patent is extended or adjusted under 35 U.S.C. 154(b) by 296 days.

(21) Appl. No.: 10/790,310

(22) Filed: Mar. 1, 2004

(65) Prior Publication Data
US 2005/0122700 A1   Jun. 9, 2005

(30) Foreign Application Priority Data
Dec. 9, 2003   (KR) .................. 10-2003-0089068

(51) Int. Cl.
*H05K 1/00* (2006.01)
*H05K 1/03* (2006.01)
(52) U.S. Cl. .............. 174/254; 174/255; 174/258
(58) Field of Classification Search .......... 174/254, 174/255, 258; 361/749–751
See application file for complete search history.

(56) References Cited

U.S. PATENT DOCUMENTS 5,408,052 A * 4/1995 Inaba et al. ........... 174/261
5,471,438 A * 11/1995 Kobayashi et al. ..... 368/281
5,742,480 A * 4/1998 Sawada et al. ........ 361/749
6,041,495 A * 3/2000 Yoon et al. ............. 29/841

* cited by examiner

*Primary Examiner*—Kamand Cuneo
*Assistant Examiner*—Jeremy C. Norris
(74) *Attorney, Agent, or Firm*—St. Onge Steward Johnston & Reens LLC

(57) ABSTRACT

A flexible printed circuit board (FPCB) which prevents a short circuit due to a crack in a bending portion is provided. The FPCB includes an end portion, a bending portion extended from the end portion, and a circuit portion extended from the bending portion. The improved FPCB includes a base film which is flexible and comprises a first via-hole formed adjacent to the end portion and the bending portion and a second via-hole formed adjacent to the bending portion and the circuit portion, a first conductive layer formed on an outer surface of at least the end portion and the bending portion, a cover layer formed on the first conductive layer, a second conductive layer which is formed on an inner surface of the end portion and is electrically connected to the first conductive layer through the first via-hole, and a third conductive layer which is formed on an inner surface of the extension circuit portion and is electrically connected to the first conductive layer through the second via-hole.

10 Claims, 3 Drawing Sheets

FLEXIBLE PRINTED CIRCUIT BOARD

RELATED APPLICATION

This application claims priority of Korean Patent Application No. 2003-89068, filed on Dec. 9, 2003, in the Korean Intellectual Property Office, the disclosure of which is incorporated herein in its entirety by reference.

BACKGROUND OF THE INVENTION

1. Field of the Invention

The present invention relates to a flexible printed circuit board (FPCB), and more particularly, to an FPCB which prevents its conductive layer from being short-circuited when it is subject to repetitive bending.

2. Description of the Related Art

An FPCB is a circuit board which can be easily bent and is typically formed by laminating a circuit pattern to a base film of a suitable resin known in the art. Such an FPCB is widely used to connect various parts of electronic equipment.

FIG. 1 shows an apparatus disclosed in Korean Patent Publication No. 1999-31984. In FIG. 1, a liquid crystal display (LCD) device includes an upper substrate 22 and a lower substrate 21 connected to the upper substrate 22, and an FPCB 30 is connected to the LCD device. A thin-film transistor and a first electrode driven by the thin-film transistor are formed in an upper portion of the lower substrate 21, and a second electrode is formed in a lower portion of the upper substrate 22.

A liquid crystal material is disposed within the LCD device between the first and second electrodes. In operation, the LCD device is typically subject to a potential difference applied between the first and second electrodes, which cause a disturbance in the orientation of the constituent liquid crystal material. Accordingly, a particular image or light pattern may be appeared in response to the spatial arrangement of the liquid crystal material. A terminal of the thin-film transistor is typically connected to a driving circuit by the FPCB 30. In addition, a driving integrated circuit (IC) 23 related to the driving of the first and second electrodes may be installed on the lower substrate 21.

FIG. 2 is an enlarged view of the portion II shown in FIG. 1 illustrating a cross-section of the FPCB 30 in detail. The FPCB 30 includes an end portion 30a, a bendable portion 30b extending from the end portion 30a, and a circuit portion 30c extending from the bendable portion 30b. A conductive layer 32 is formed on an inner surface 31" of a base film 31, covering substantially the entire surface thereof. Another conductive layer 33 is formed on an outer surface 31' of the base film 31, substantially covering the circuit portion 30c. The conductive layer 33 is electrically connected to the other conductive layer 32 through a via-hole or connection hole 34.

A plating layer 36 formed of nickel-gold or tin is disposed on the first conductive layer 32 and covers the end portion 30a and the bendable portion 30b in order to prevent oxidization of the first conductive layer 32, thereby improving electric contact. In order to further prevent the first and second conductive layers 32 and 33 from being cracked, oxidized, scratched, or short-circuited with an electric device, cover layers 35b and 35a are formed on the first and second conductive layers 32 and 33, respectively, and covers basically the circuit portion 30c where the plating layer 36 is not formed. The first and second conductive layers 32 and 33 are formed of a metal such as copper and comprise a predetermined circuit for driving the electronic device. Typically, the first and second conductive layers 32 and 33 are connected to each other through a single via-hole.

The first conductive layer 32 is required to be electrically connected to a terminal 24 of an electronic device (e.g., the LCD device) as shown in FIG. 2. Usually, since a gap between conducting lines in the first conductive layer 32 is very narrow, the first conductive layer 32 is electrically connected to the terminal 24 by an anisotropic conductive film (ACF) 25.

FPCB may be subject to repetitive bending, for example, in order to connect the FPCB 30 having the above-described structure to the terminal 24 of the LCD device during a manufacturing process of the device, the bendable portion 30b of the FPCB 30 needs to be repeatedly folded and unfolded. This generates a repetitive compressive and tensile stress onto the conductive layer 32, and as a result, a crack C is often developed particularly at a portion A of the first conductive layer 32 where the cover layer 35b ends. The crack C becomes larger as such a folding and unfolding are repeated and eventually short-circuits the first conductive layer 32. Consequently, a fundamental purpose of the FPCB 30 for providing connection between two parts (e.g., the terminal 24 of the LCD device and a terminal of a driving circuit of the LCD device) cannot be accomplished.

To overcome this problem, the cover layer 35b may be further extended to cover substantially the entire portion of the first conductive layer 32 and the plating layer 36 of the bending portion 30b. However, this arrangement hinders the subsequent bonding of the ACF 25 with the plating layer 36.

SUMMARY OF THE INVENTION

The present invention provides a flexible printed circuit board (FPCB) which can prevent a short circuit problem due to a crack development in a bending portion of the FPCB.

According to one aspect of the present invention, a flexible printed circuit board comprises: a base film formed of a flexible insulation material and having an end portion and a main portion, the base film including a first connection hole formed adjacent to the end portion and a second connection hole formed at the main portion; a first conductive layer formed on an outer surface of the base film including an area covering the first and second connection holes of the base film; a second conductive layer formed on an inner surface of the base film including an area covering the first connection hole of the base film, the second conductive layer being electrically connected to the first conductive layer through the first connection hole; and, a third conductive layer formed on an inner surface of the base film including an area covering the second connection hole of the base film, the third conductive layer being electrically connected to the first conductive layer through the second connection hole, the third conductive layer being separated from the second conductive layer.

The flexible printed circuit board preferably further includes a first cover layer formed of a flexible insulation material and covering the first conductive layer, and a second cover layer formed of a flexible insulation material and covering the third conductive layer. The first and third conductive layers define a circuit pattern for an electronic device.

The flexible printed circuit board preferably further includes a fourth conductive layer substantially covering the second conductive layer for connection to the electronic device. The fourth conductive layer is formed of a material comprising nickel, gold, or aluminum. The first, second and third conductive layer are preferably formed of copper, or copper alloy.

The end portion of the circuit board is configured to connect to a terminal of an electronic device, such as a liquid crystal display device.

The first conductive layer is preferably located substantially along a neutral line of a curve where an internal stress is about zero when the circuit board is subject to bending.

BRIEF DESCRIPTION OF DRAWINGS

The above and other features and advantages of the present invention will become more apparent by describing in detail preferred embodiments thereof with reference to the attached drawings in which.

DETAILED DESCRIPTION OF EMBODIMENTS

Figure 1:
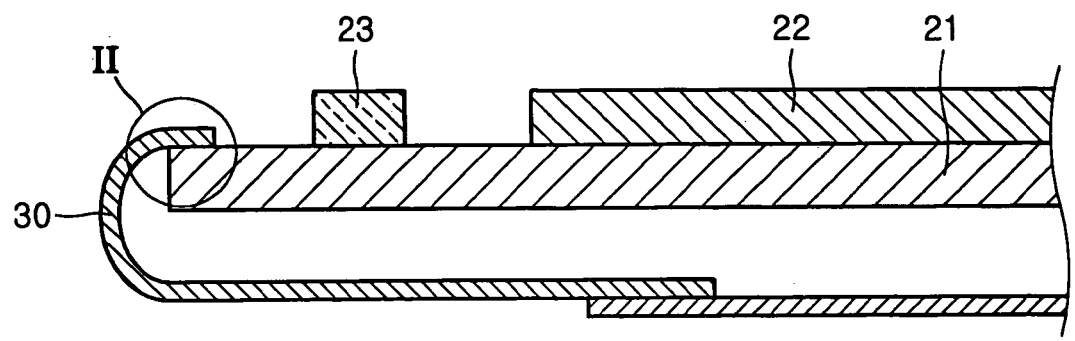
FIG. 1 is a schematic cross-section view of a conventional flexible printed circuit board (FPCB) connected to an end portion of a display panel.
Figure 2:
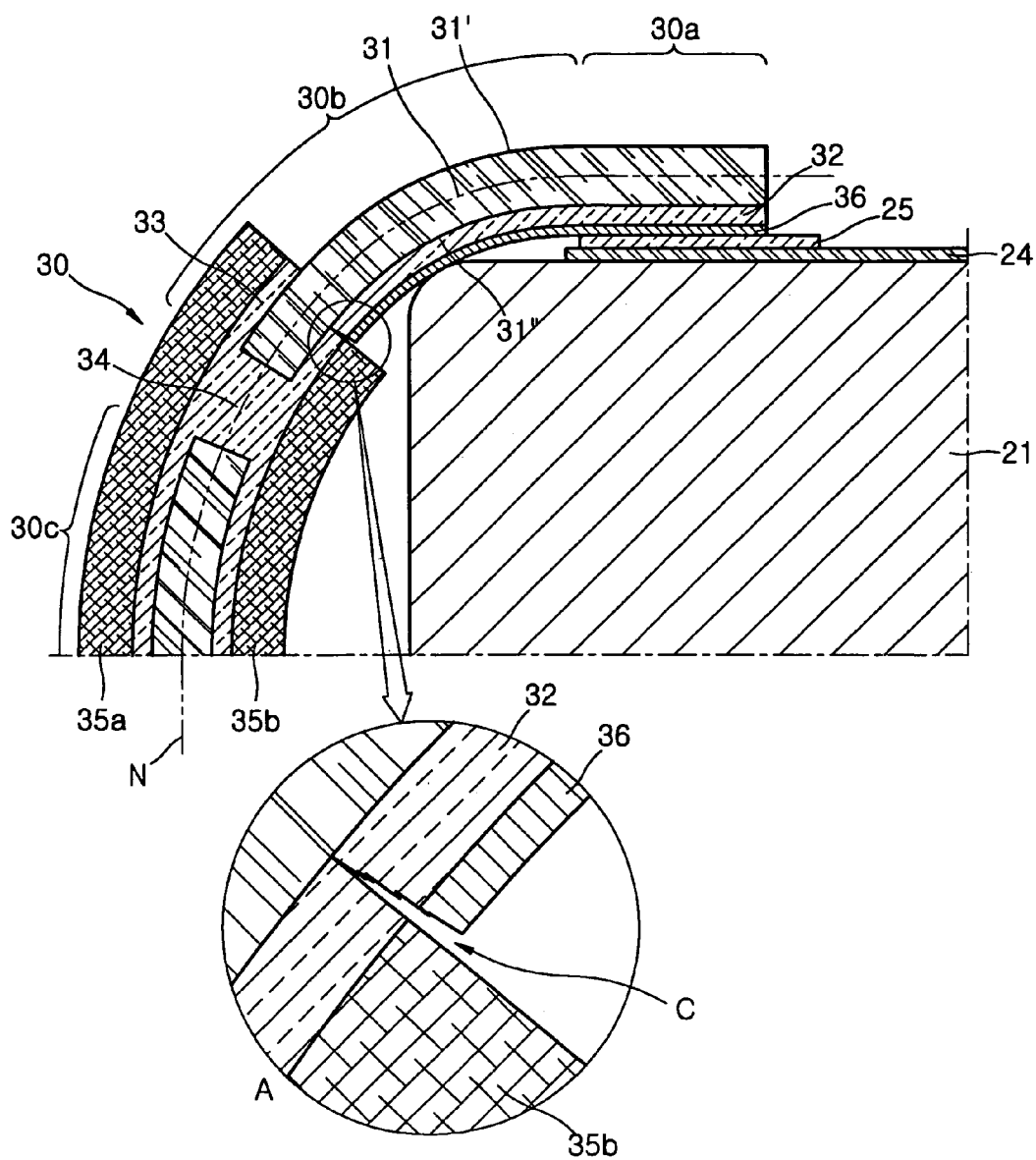
FIG. 2 is a schematic and enlarged cross-sectional view of the portion II shown in FIG. 1.
Figure 3:
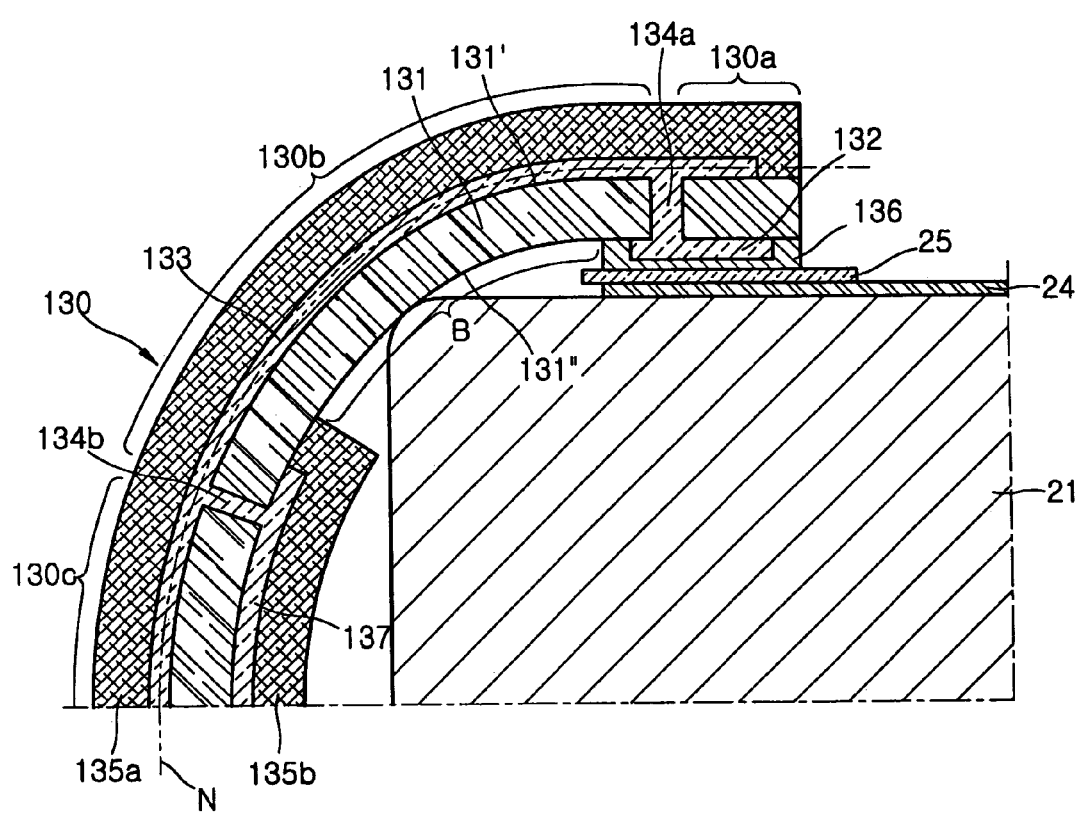
FIG. 3 is a schematic view illustrating an FPCB installed to a display panel, according to one embodiment of the present invention.

Referring to FIG. 3, a flexible printed circuit board (FPCB) 130 according to one embodiment of the present invention includes an end portion 130a connected to a terminal 24 of a device (e.g., a liquid crystal display (LCD) device), and a main board portion. The main board portion of the FPCB includes an interim portion 130b extending from the end portion 130a, and a circuit portion 130c extending from the bending portion 130b. The bending portion 130b is a portion that is configured to be subject to a major bending for the reasons described above and further described herein after. The circuit portion 130c is a portion that is located on the opposite side of the end portion 130a beyond the interim portion 130b for providing a circuit pattern for an electronic device (e.g., a LCD device). The circuit portion 130c may be subject to bending in addition to the interim portion 130b.

The FPCB 130 includes a base film 131, a first conductive layer 133 formed on an outer (or upper) surface 131' of the base film 131, and a second conductive layer 132 formed on an inner (or lower) surface 131" of the base film 131. The first conductive layer covers an area including the end portion 130a, interim portion 130b and circuit portion 130c, and the second conductive layer covers a substantial portion of the end portion 130a. The first and second conductive layers are preferably formed of copper or copper alloy.

A cover layer 135a of flexible insulation material is formed on the first conductive layer 133 to cover and protect the first conductive layer 133, and a conductive plating layer 136 is formed on the second conductive layer 132 to improve electrical contact with the terminal 24 and further to prevent oxidization of the copper layers.

A third conductive layer 137 is formed on an inner (or lower) surface 131" of the base film 131 to cover an area including the circuit portion 130c, but not including the end portion 130a and at least some of the interim portion 130b (i.e., area B) of the inner surface 131" of the base film 131. However, according to one embodiment of the invention, the second conductive layer 132 and the third conductive layer may be unitarily disposed on the inner surface 131" of the base film 131, then, the conductive layer on the area B can be removed using an etching process.

In addition, another cover layer 135b of flexible insulation material can be formed on the third conductive layer 137 to cover and protect the third conductive layer 137.

The first, second and third conductive layers 132, 133, and 137, and the cover layers 135a and 135b of the bending portion 130b are formed in a manner to firmly adhere to the base film 131 and maintain a desired strength and flexibility.

A first via-hole (connection hole) 134a is formed at the base film 131 adjacent to the end portion 130a and the interim bendable portion 130b. The first conductive layer 133 and the second conductive layer 132 are electrically connected to each other through the first via-hole 134a. In addition, a second via-hole 134b is formed at the base film 131 at the main board portion (i.e., adjacent to the interim portion 130b and the circuit portion 130c). The first conductive layer 133 and the third conductive layer 137 are electrically connected to each other through the second via-hole 134b. As a result, the second conductive layer 132 electrically connected to the terminal 24 is also electrically connected to the third conductive layer 137 through the first conductive layer 133.

In one embodiment of the present invention, each of the first and second via-holes 134a and 134b is formed as a micro via-hole having a small diameter. Since the micro via-hole has a small diameter, it is preferably stuffed by plating its inner surface with a conductive material. Accordingly, a metal forming an anisotropic conductive film (ACF) 25 does not permeate into the first via-hole 134a. As a result, contamination of a bonding head can be prevented during the manufacturing process.

To manufacture the FPCB 130, the base film 131 having the first and second via-holes 134a and 134b are formed of a resin, preferably of polyimide. The first conductive layer 133 is formed in a predetermined pattern on the outer surface 131' of the base film 131 using laminating and etching processes. The second and third conductive layers 132 and 137 are formed in a predetermined pattern on the inner surface 131" of the base film 131 using laminating and etching processes. For this, a unitary conductive layer can be formed on the inner surface 131" using a single laminating process, and then a middle portion of the conductive layer located in the area B can be removed using an etching process so that the second and third conductive layers 132 and 137 are separately formed from each other, as mentioned above. This separation is performed to separate the end portion 130a connected to the terminal 24 of the LCD device from the circuit portion 130c, and provides more flexibility particularly at the region B where the cover 137 is not applied. According to one embodiment of the present invention, the FPCB 130 having conductive layers thereon is configured to set a neutral line N of a curve (i.e., a central line where an internal stress is about 0 when the FPCB 130 is bent) is to be generally located along the first conductive layer 133. Accordingly, such a stress is not applied to the first conductive layer 133 of the interim (bending) portion 130b even it is subject to repetitive bending. Thus, in addition to the separation of the conductive layer and omission the cover layer 137 at region B as discussed above, this stress-neutralization arrangement further secure a flexibility of the FPCB without developing of cracks in the first conductive layer 133 upon repeated bending.

Moreover, utilizing the FPCB 130 having the above-described structure and configurations, since the first conductive layer 133 formed on the outer surface 131' in the bending portion 130b is covered with the flexible cover layer 135a, a crack does not occur even when the bending portion 130b is folded and unfolded many times, for example, during manufacturing of the electronic equipment with the FPCB. Therefore, a short circuit of the FPCB 130 is effectively prevented. In addition, since the base film 131 is formed of a sufficiently flexible material, such repetitive bending does not cause a crack development also in the base film.

After the first conductive layer 133 is formed, the cover layer 135a is formed on the first conductive layer 133. After the second conductive layer 132 is formed, the plating layer 136 is formed on the second conductive layer 132. After the third conductive layer 137 is formed, the cover layer 135b is formed on the third conductive layer 137. The first, second, and third conductive layers 133, 132, and 137 are formed of metal having good conductivity such as copper or copper alloy, and the plating layer 136 is formed of nickel, gold, or aluminum, or other metal known in the art for this purpose.

Accordingly, as described above, the FPCB of the present invention can prevent a short circuit due to a crack developing in a bending portion.

Although only a few embodiments of the present invention have been shown and described, it will be understood by those skilled in the art that changes may be made to these elements without departing from the spirit and scope of the invention, which is defined in the appended claims and their equivalents.

What is claimed is:

1. A flexible printed circuit board comprising;
   a base film formed of a flexible insulation material and having an end portion and a main portion, the main portion including an interim portion extending from the end portion and a circuit portion extending from the interim portion, the base film including a first connection hole formed adjacent to the end portion and a second connection hole formed at the main portion;
   a first conductive layer formed on an outer surface of the base film including an area covering the first and second connection holes of the base film;
   a second conductive layer formed on an inner surface of the base film including an area covering the first connection hole of the base film, said second conductive layer formation area excluding the main portion of the base film, the second conductive layer being electrically connected to the first conductive layer through the first connection hole;
   a third conductive layer formed on an inner surface of the base film including an area covering the second connection hole of the base film, said third conductive layer formation area excluding the end portion and the interim portion of the base film, the third conductive layer being electrically connected to the first conductive layer through the second connection hole, the third conductive layer being separated from the second conductive layer;
   a first cover layer formed of a flexible insulation material and covering the first conductive layer; and
   a second cover layer formed of a flexible insulation material and covering the third conductive layer, said second cover layer formation area excluding the end portion and the interim portion of the base film such that the flexible printed circuit board is subject to repetitive bending primarily at the interim portion thereof without developing cracks in the bending portion.

2. The flexible printed circuit board of claim 1, wherein the first and third conductive layers including a circuit pattern.

3. The flexible printed circuit board of claim 1, further comprising a fourth conductive layer substantially covering the second conductive layer.

4. The flexible printed circuit board of claim 3, wherein the fourth conductive layer is formed of nickel, gold, or aluminum.

5. The flexible printed circuit board of claim 1, wherein the base film is formed of a resin.

6. The flexible printed circuit board of claim 1, wherein the first, second and third conductive layer are formed of a material comprising copper.

7. The flexible printed circuit board of claim 1, wherein the first and second connection holes are filled with a conductive material.

8. The flexible printed circuit board of claim 1, wherein the end portion of the circuit board is configured to connect to a terminal of an electronic device.

9. The flexible printed circuit board of claim 8, wherein the electronic device is a liquid crystal display device.

10. The flexible printed circuit board of claim 1, wherein the first conductive layer is located substantially along a neutral line of a curve where an internal stress is about zero when the circuit board is subject to bending.

* * * * *